(12) United States Patent
Kasai et al.

(10) Patent No.: US 6,672,883 B2
(45) Date of Patent: Jan. 6, 2004

(54) ELECTRICAL JUNCTION BOX FOR A VEHICLE

(75) Inventors: Koji Kasai, Yokkaichi (JP); Nobuchika Kobayashi, Yokkaichi (JP); Yuuji Saka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 245 days.

(21) Appl. No.: 09/908,900

(22) Filed: Jul. 20, 2001

(65) Prior Publication Data

US 2002/0009907 A1 Jan. 24, 2002

(30) Foreign Application Priority Data

Jul. 21, 2000 (JP) ........................................ 2000-220176

(51) Int. Cl.$^7$ .............................................. H01R 12/00
(52) U.S. Cl. ........................ 439/76.2; 439/74; 439/949
(58) Field of Search .............................. 439/76.1, 76.2, 439/65, 74, 949

(56) References Cited

U.S. PATENT DOCUMENTS 5,530,625 A    6/1996  VanDerStuyf et al.
6,402,530 B1 * 6/2002  Saito et al. ................. 439/76.2
6,506,060 B2 * 1/2003  Sumida et al. ............. 439/76.2

FOREIGN PATENT DOCUMENTS

DK      30 48 451 A1    7/1982
EP      0 703 117 A2    3/1996
WO      WO 98 18180     4/1998

* cited by examiner

Primary Examiner—Lynn Feild
Assistant Examiner—Son V. Nguyen
(74) Attorney, Agent, or Firm—Oliff & Berridge, PLC

(57) ABSTRACT

The present invention provides an electrical junction box suitable for connection, for example, to a wire harness in a vehicle such as an automobile. The box is adapted to provide electrical connection to a plurality of electrical connectors, a plurality of fuses and a plurality of relays, the box having a casing, a connector circuit having a plurality of first bus bars, a fuse circuit discrete from the connector circuit and having a plurality of second bus bars and a relay circuit discrete from the connector circuit and having a plurality of third bus bars. At least one of the second and at least one of the third bus bars are welded to respective ones of the first bus bars at welding portions which are received in a protection structure which presses them towards each other. The protection structure clamps the joined welding portions so that the risk of disconnection of the welded connection is reduced or avoided.

9 Claims, 11 Drawing Sheets

ELECTRICAL JUNCTION BOX FOR A VEHICLE

BACKGROUND OF THE INVENTION

1. Field of Invention

The present invention relates to an electrical junction box suitable to be connected for example to one or more wire harnesses in a vehicle such as an automobile.

2. Description of Related Art

Recently, the increase of electrical and electronic component parts which are mounted in a vehicle has led to increase of circuits to be accommodated in electrical connection boxes and junction boxes in the vehicle. Thus, when forming branch circuits at a high density, it is necessary to mount a large number of component parts on a junction box or the like, which causes increase of manufacturing complexity.

In a junction box disclosed in JP-A-2000-92660 and shown in present FIG. 12, bus bars 5A–5D are laminated one upon another between an upper case part 2 and a lower case part 3, with insulation plates 4A–4E interposed between the bus bars 5A–5D. The upper case part 2 has a connector receiving portion 2a, a relay receiving portion 2b, and a fuse receiving portion 2c, on which in use connectors 6, relays 7 and fuses 8 are mounted respectively. Terminals of the connectors 6, the relays 7 and the fuses 8 are connected to tabs 5a projecting from the bus bars directly or are connected to the bus bars through relaying terminals. The lower case part 3 has also a connector receiving portion 3a to connect connectors to tabs projecting from the bus bars.

In the junction box 1, with the increase of the number of circuits, the area and the number of layers of the bus bars increase and thus the size of the junction box becomes large. If the connector, relay and fuse receiving portions are arranged on both the upper and lower case parts to connect connectors, relays and fuses to internal circuits of the junction box, it is possible to make the area of the junction box smaller than in the case where the receiving portions are mounted on only the upper case part or the lower case part.

However, if the connector, relay and fuse receiving portions are mounted on both the upper and lower case parts such that they are opposed vertically, the bent tabs of bus bars must overlap each other and thus cannot be easily arranged. In this case, it is necessary to form tabs on bus bars of other layers, which causes an increase of number of layers of bus bars, and thus leads to the increase of the height of the junction box. That is, the junction box is necessarily large.

Further, the above-described junction box is so constructed that the bus bars are connected to the connectors, the fuses and the relays. Thus, when the specification of the connection between the internal circuit and the fuses and/or the relays is altered, it is necessary to alter the entire internal circuit. Consequently the above-described junction box is incapable of allowing a circuit alteration easily.

Some proposals have been made for replaceable modules in electrical circuits of automobiles.

U.S. Pat. No. 5,179,503 shows a modular automobile power distribution box having replaceable modules carrying relays or fuses. The relays or fuses in each module are directly connected to terminals of leads of wire harnesses. A pair of bus bars connect power terminals to the fuses of three maxi-fuse modules. There is no discussion of interconnection of the modules.

U.S. Pat. No. 5,581,130 discloses removable multi-function modules in individual casings which are mounted on a circuit board. Each module is electrically connected to the power supply distribution layer of the board by a pin. Alternatively three modules are shown connected together by two electrical and mechanical coupling bars.

SUMMARY OF THE INVENTION

It is an object of the present invention to provide a junction box which can be made thin without increasing the number of layers of bus bars to be accommodated therein and which can cope with a circuit alteration easily.

According to the present invention, there is provided an electrical junction box adapted to provide electrical connection to a plurality of electrical connectors, a plurality of fuses and a plurality of relays, having (i) a casing;

(ii) a connector circuit having at least one connector circuit insulation substrate and a plurality of first bus bars fixed on the insulation substrate, the first bus bars being arranged to provide electrical connection to electrical connectors in use;

(iii) a fuse circuit having at least one fuse circuit insulation substrate, which is discrete from the connector circuit, and a plurality of second bus bars fixed on the fuse circuit insulation substrate, the second bus bars being arranged to provide electrical connection to fuses in use; and (iv) a relay circuit having at least one relay circuit insulation substrate, which is discrete from the connector circuit, and a plurality of third bus bars fixed on the relay circuit insulation substrate, the third bus bars being arranged to provide electrical connection to relays in use;

(v) wherein at least one of the second bus bars and at least one of the third bus bars are joined to respective ones of the first bus bars by welded connections formed by welding together of respective welding portions of the bus bars projecting from the respective insulation substrates; and (vi) wherein, at at least one of the welded connections, the junction box is provided with a protection structure which receives the welding portions of the respective bus bars of the welded connection and presses the welding portions towards each other.

Preferably the two welding portions at the welded connection are insertable in a press-fit manner in a recess of the protection structure.

The protection structure provided for the or each welded connections of the bus bars has the function of pressing or clamping the joined welding portions of the respective bus bars, so that the risk of disconnection of the welded connection is reduced or avoided. Preferably the protection structure clamps the welding portions resiliently, thereby reducing the risk that the welding portions are disconnected by vibration or shock forces occurring in use of the junction box. The protection structure is preferably formed of molded plastics material, and as described below may be a portion of the casing of the junction box. In this case, the protection structure is fitted on the welded connection during assembly of the junction box in such a manner that the welded connection is fixedly held in the recess of the protection structure.

The electrical junction box of the present invention has a modular construction. As described above, in the junction box of the present invention, the fuse circuit substrate and the relay circuit substrate are separately provided from the connector circuit substrate and are then joined by welding of the bus bars. This is in contrast, in the conventional method, electrically conductive sheets are punched to form unitarily the connector connection circuit, the fuse connection circuit, and the relay connection circuit and form tabs to be connected to connectors, tabs to be connected to fuses, and tabs to be connected to relays and stacked in a single stack, the circuits thus being handled and arranged in a complicated manner. Consequently, in the conventional method, the area of the bus bars increases and a large number of bus bars are necessary.

On the other hand, in the present invention, because the circuits are separately provided and welded, it is possible to avoid the complication of tabs overlapping each other and avoid a large number of bus bars. Thus, it is possible to form a thin or compact junction box. Further, because the circuits of the bus bars can be handled and arranged easily, the area of each bus bar can be reduced. Consequently, even though the bus bars are separately provided for the connector connections on the one hand and the fuse connections and the relay connections on the other hand, it is possible to reduce the total area of the bus bars and avoid increase of the area of the junction box.

Preferably, the connector module having the connector circuit, the fuse module having the fuse circuit, and the relay module having the relay circuit are all separately provided, i.e., the respective insulation substrates are discrete from each other. Thus, if the specification of any one of the connector circuit, the fuse circuit, and the relay circuit is altered, only the design of any one of the modules need be changed. That is, the construction can cope with the alteration of the specification easily.

The first bus bars are provided separately from the second or/and third bus bars but connected thereto by means of welding. Thus this construction does not reduce reliability of the electrical connections. The welding portions may be connected to each other by ultrasonic welding, resistance welding, laser welding or gas welding. The welding portions connecting the modules to each other are inserted into the protection structure having an accommodation space or recess capable of accommodating the welding portions and are pressed towards each other by a protection portion. Thus, even though the circuits are subjected to vibrations or the like, the welding portions are securely protected and thus prevented from being separated from each other.

It is preferable to form a widening guide portion at an entrance of the recess or accommodation space of the protection structure. This construction allows the welding portions to be guided into the recess easily and securely when covering the welded connection with the protection structure. It is preferable to form the protection structure integrally with a casing, e.g., an upper case part or a lower case part accommodating the connector circuit, the fuse circuit, and the relay circuit. Thereby it is possible to enclose each circuit with the upper and lower case parts and at the same time press the welding portions into the protection structures by press fitting.

Although the fuse circuit and the relay circuit may be separately formed, it is possible to integrate them with each other to form a fuse/relay composite circuit which receives fuses and relays on the same substrate which has bus bars for fuses and relays thereon. In this case, if it is necessary to connect the circuit of any of the bus bars for fuses to any of the bus bars for relays, the respective bus bars may be welded to each other or the bus bars may be integrally formed.

BRIEF DESCRIPTION OF THE DRAWINGS

Embodiments of the invention will now be described by way of non-limitative example with reference to the accompanying drawings. In the drawings.

DETAILED DESCRIPTION OF PREFERRED EMBODIMENTS

Exemplary embodiments of the present invention will be described below with reference to drawings.

Figure 1:
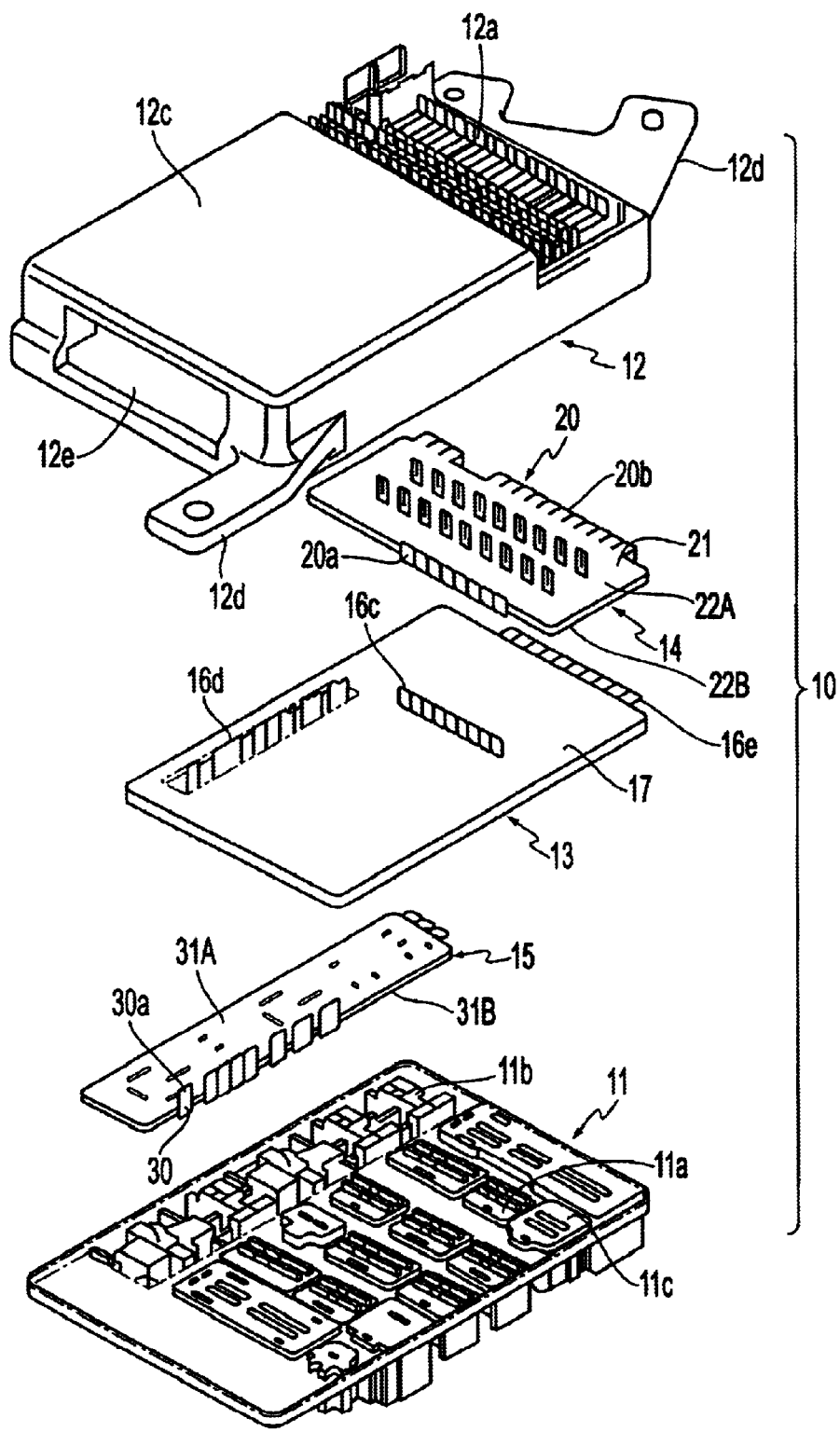
FIG. 1 is a schematic exploded perspective view showing a junction box of a first embodiment of the present invention.

FIG. 1 is a schematic exploded perspective view showing component parts constituting a junction box 10 which, in use, is mounted in a vehicle body and is connected to a wire harness of the vehicle body. The box has a casing formed of molded synthetic resin comprising upper and lower casing parts herein called lower case part 11 and upper case part 12. In the casing are a connector module 13 constituting a connector circuit, a fuse module 14 constituting a fuse circuit and a relay module 15 constituting a relay circuit. Although not shown in FIG. 1, the casing formed by the lower case part 11 and the upper case part 12 accommodates an electronic control unit 40, seen in FIGS. 2 and 3.

The lower case part 11 has a plurality of connector receiving portions 11a in the form of sockets projecting outwardly and a plurality of relay receiving portions 11b also in the form of sockets arranged in a row along one longitudinal side. The upper case part 12 has a fuse receiving portion 12a having sockets to receive a plurality of fuses, formed at one widthwise side. The remaining part of the upper case part 12 is formed as a closed portion 12c which covers and contacts the upper surface of the electronic control unit 40 housed within the case. The upper case part 12 also has a connector receiving portion or socket 12e on the periphery face of its other widthwise side. The lower case part 11 and the upper case part 12 are locked to each other by fitting their peripheral walls on each other. Suitable conventional locking fittings (not shown) may be provided. The upper case part 12 also has fixing brackets 12d projecting from its opposite ends, for fixing it to for example a vehicle body.

Figure 4:
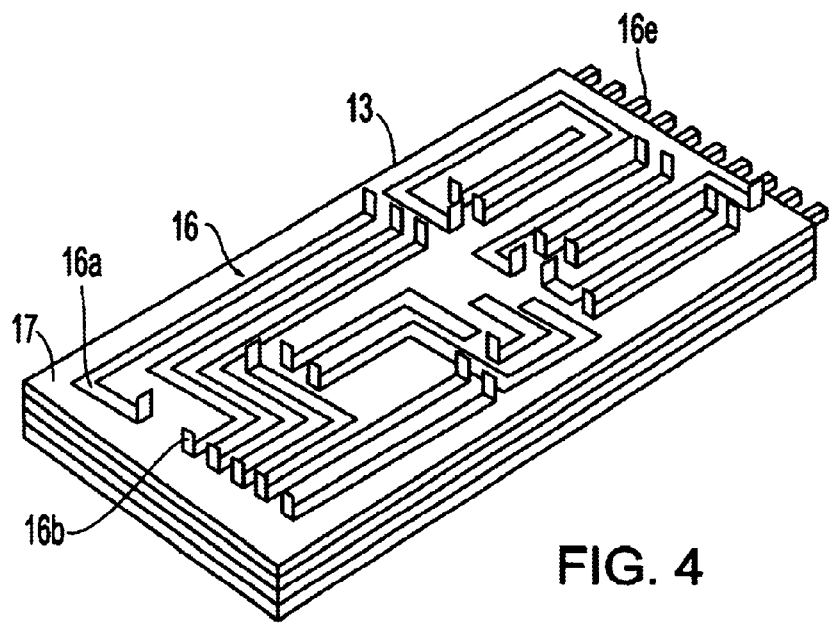
FIG. 4 is a schematic perspective view of a connector module of the box of FIG. 1 viewed from the underside thereof.

FIG. 4 is a schematic perspective view showing the bottom side of the connector module 13 of FIG. 1. The connector module 13 has a plurality of layers of connector connection bus bars 16 laminated one upon another with interposed insulation plates in a stack 17. In this embodiment, there are four layers of the connector connection bus bars. In FIG. 1, the connector module 13 is schematically shown, with one insulation plate of the stack 17 as the uppermost layer. By molding in resin, it is possible to form the insulation plate stack 17 and a multi-layer integral assembly of the bus bars 16.

Each layer of the bus bars 16 of the connector module 13 has circuit portions 16a having a required configuration obtained by punching a conductive plate. At least one tab 16b stands perpendicularly from each circuit portion 16a towards the lower case part 11 to project through a terminal hole 11c of one of the connector receiving portions 11a of the lower case part 11. A connector (not shown) secured on one end of a wire harness is in use fitted in the connector receiving portion 11a to connect a terminal in the connector to the tab 16b.

As shown in FIG. 1, the connector connection bus bars 16 have welding tabs 16c, 16d, projecting from holes of the insulation plate stack 17 at the upper side of the connector circuit 13 and welding tabs 16e projecting from the periphery of the insulation plate stack 17. The welding tabs 16c, 16e are welded to fuse connection bus bars 20 formed on the fuse module 14. The welding tabs 16d are welded to relay connection bus bars 30 formed on the relay module 15 which project upwardly through a slot in the connector module 13. The welding tabs 16c and the welding tabs 20a of the bus bars 20 are placed adjacent each other vertically. Similarly the welding tabs 16d and the welding tabs 30a of the bus bars 30 are placed adjacent each other extending vertically. The welding tabs 16e are welded to welding tabs 20b of the fuse connection bus bars 20 by laminating them on each other vertically and horizontally. There are thus a plurality of sets of each of the welding tabs 16c, 16d and 16e in each case parallel with one another.

Figure 5:
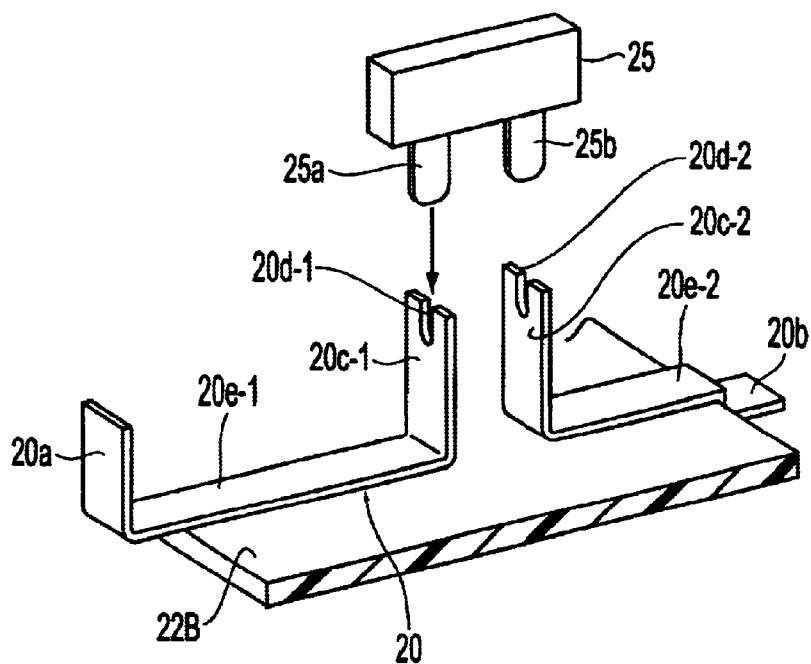
FIG. 5 is a schematic view showing fuse connection bus bars.
Figure 7:
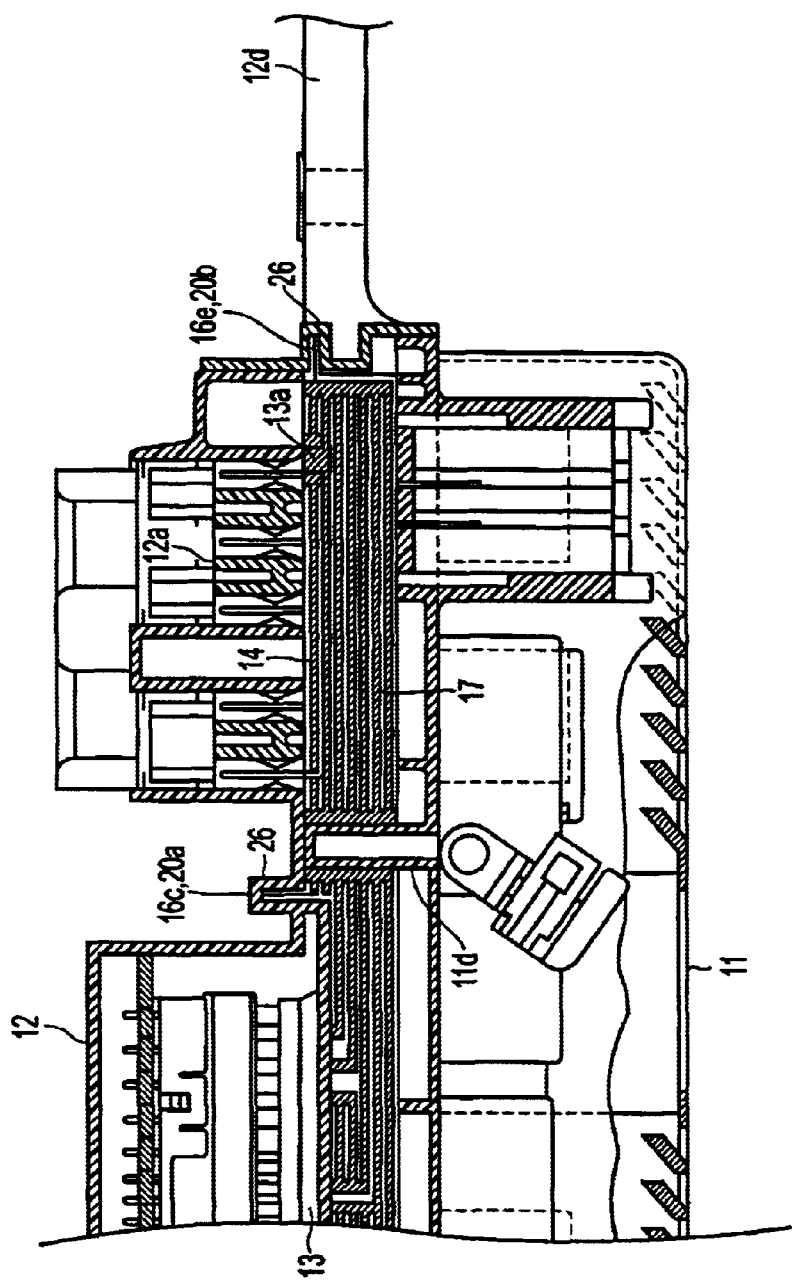
FIG. 7 is a sectional view showing in more detail a port of the junction box as seen in FIG. 2.

The fuse module 14, partly shown schematically in FIG. 5, has the fuse connection bus bars 20 arranged between two superimposed insulation plates 22A and 22B (see FIG. 1), formed by molding resin. The fuse connection bus bars 20 in use connect to terminals 25a or 25b of replaceable fuses 25. As shown in FIG. 5 (where the upper insulation plate is not shown), each fuse connection bus bar 20 has horizontal portions 20e-1 and 20e-2 fixed to the substrate 22B, terminal portions 20c-1 and 20c-2 formed by bending the fuse connection bus bar 20 upward at one end of the horizontal portion 20e-1 and 20e-2, and pressure connection grooves 20d-1 and 20d-2 formed at the upper end of the terminal portions 20c-1 and 20c-2 respectively to allow the terminals 25a and 25b of the fuse 25 to be fitted in the grooves 20d-1 and 20d-2 respectively. The end of one bus bar 20 opposite to its end to be connected to the terminal 25a projects to form the welding portion 20a. The end of the other bus bar 20 opposite to its end to be connected to the terminal 25b projects laterally to form the welding portion 20b. The welding portion 20a is projected horizontally from one edge of the substrate 21 in its longitudinal direction and bent vertically upward so that in the assembled position the welding portion 20a and the welding portion 16c of a connector bus bar 16 lie adjacent each other, as shown in FIG. 7. The welding portion 20b is projected horizontally from the other longitudinal side of the substrate 21 and stepped vertically downward so that in the assembled condition the welding portion 20b and the welding portion 16e of a connector bus bar 16 are superimposed, as also shown in FIG. 7. It is possible to fix the bus bar 20 to the insulation plate 22B by means of caulking. In this case, a caulking projection (not shown) is formed on the insulation plate 22B and inserted through a hole formed on the bus bar 20. Then, the caulking projection is deformed to fix the bus bar 20 at a predetermined position.

The relay module 15 has a construction similar to that of the fuse module 14. More specifically, the relay module 15 has a large number of relay connection bus bars 30 fixed between upper and lower insulation plates 31A and 31B (see FIG. 1). The bus bars 30 are separated from each other and individually connected to terminals of relays in use. As shown schematically in FIG. 6 (where the insulation plate 31B is not shown), each bus bar 30 of the relay module 15 has a horizontal portion 30b, a terminal portion 30c formed by bending the bus bar 30 upwards at one end of the horizontal portion 30b, and a pressure connection groove 30d formed at the outer end of the terminal portion 30c to allow a terminal 35a of a relay 35 to be fitted therein. The welding tab 30a is formed by bending the other end of the horizontal portion 30b in the shape of an "L" to permit the welding tab 30a and the welding tab 16d of one of the connector bus bars 16 to be aligned adjacent each other vertically in the assembled state.

FIG. 7 shows protection structures 26 which respectively protect the welded portions 16c, 20a and the welded portions 16e, 20b at which the connector module 13 and the fuse module 14 are connected to each other. In each case, the protection structure 26 is integral with the upper case 12 and is provided by walls of a recess which receives the pair of welded portions as a press fit. This is illustrated, with variations, in more detail in FIGS. 8A, 8B and 9. In correspondence to the arrangement and size of the welded portions 16c, 20a (or welded portions 16e, 20b), there is provided an accommodation space 26a or recess for the welded portions 16c, 20a. The width L1 of each space 26a in the direction in which the welded portions 16c and 20a are superimposed on each other is a little smaller than the dimension L2 which is the sum of the thickness of the portion 16c and that of the portion 20a. Thereby the welded portions 16c, 20a can be inserted into the spaces 26a by press fitting. A guide portion 26b widening outwardly is here shown formed at the entrance of the space 26a, and serves as a guide surface for guiding the united welded portions 16c, 20a into the space 26a.

FIG. 7 also shows a locating projection 11d which is not shown in FIG. 1 and which extends upwardly through a corresponding aperture in the connector module 13, and a locating projection 13a (not shown in FIGS. 1 and 4) of the module 13 which projects into a corresponding aperture of the module 14.

In assembling the junction box 10 of FIG. 1, initially with the fuse module 14 disposed over one portion of the connector module 13, the welding tabs 20a and 20b of the fuse connection bus bars 20 are welded to the welding tabs 16c and 16e of the connector connection bus bars 16, by aligning the respective tabs next to each other and welding them together. Then, with the relay module 15 disposed under one side of the connector module 13 in the longitudinal direction thereof, the welding tabs 30a of its bus bars 30 are welded to the welding tabs 16d of the bus bars 16 by aligning the respective tabs next to each other and welding them together. The welding tabs are welded to each other by a suitable welding method such as ultrasonic welding, resistance welding, laser welding or gas welding. It is preferable to form a projection P (see FIGS. 8A, 8B and 9) on one or both confronting surfaces of each of the welding portions 16c, 20a, 16e, 20b, 30a, and 16d to increase the welding effect at the projection P.

As described above, the fuse module 14 is mounted over the connector module 13 at one widthwise side thereof, and the relay module 15 is disposed under the connector module 13 at one longitudinal side thereof to integrate the three modules. Then, this subassembly of the three modules 13, 14 and 15 is accommodated in the lower case part 11. In this case, the terminal portions of the connector module 13 are disposed in the connector receiving sockets 11a, and the terminal portions 30c of the relay module 15 are disposed in the relay receiving sockets 11b.

Then, the electronic control unit 40 (see FIGS. 2 and 3) is mounted on the connector module 13 at a portion thereof on which the fuse module 14 is not mounted. The electronic control unit 40 has, at one side thereof, a connector portion 44 having bent and projecting conductive pins 43 connected with electrical conductors 42 fixed to a substrate 41 thereof. The electrical conductors 42 are connected to tabs 16f projecting from the bus bars 16 of the connector module 13. The conductors 42 are connected to a large number of electronic component parts 45 mounted on the substrate 41. The electronic component parts 45 are fixed to the substrate 41, with the electronic component parts 45 projecting downward. The welding tabs of the bus bars 16, 20 and 30 are disposed in a dead space below the electronic control unit 40.

After the electronic control unit 40 is mounted on the connector module 13, the upper case part 12 is mounted on the lower case part 11. At this time, the terminal portions 20c of the bus bars 20 fixed to the fuse module 14 become located in the fuse receiving portions 12a.

Figure 8A:
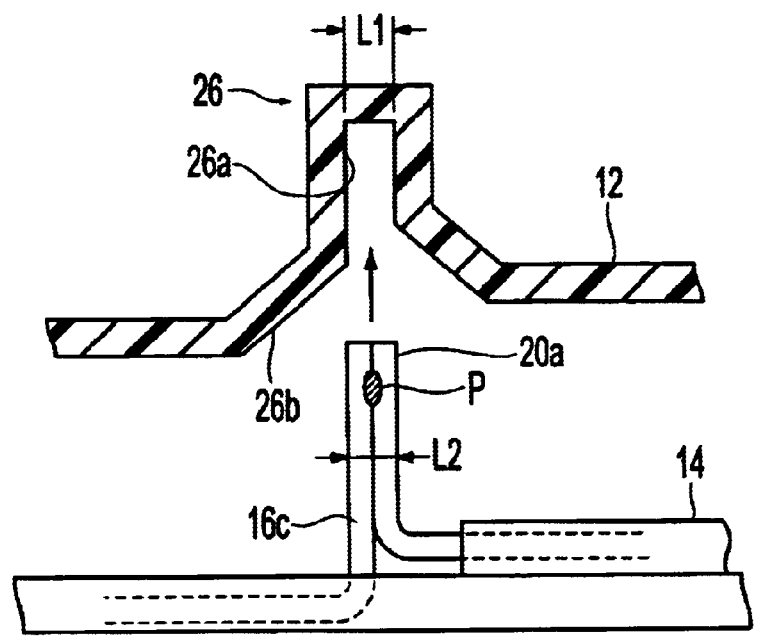
FIGS. 8A and 8B are sectional views showing the insertion of a welded connection into a protection structure by press fitting.
Figure 8B:
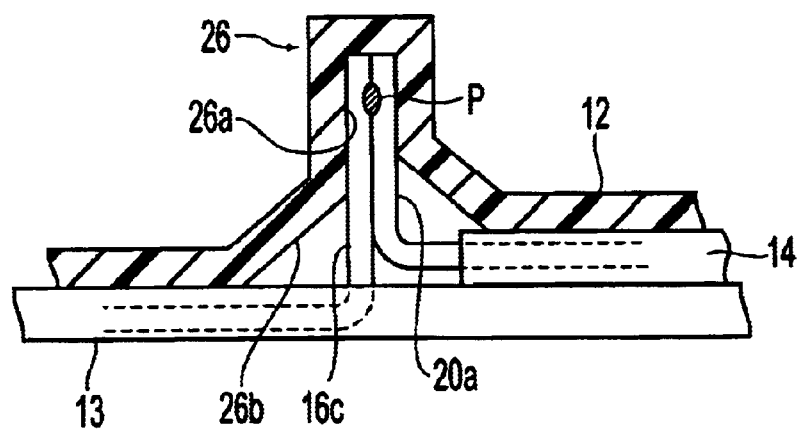
Figure 9:
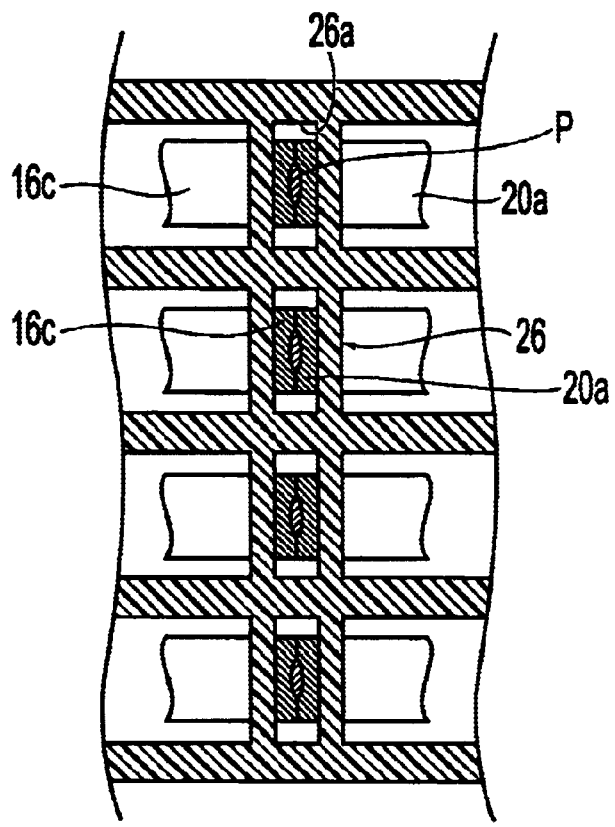
FIG. 9 is a sectional plan view showing welded connections inserted into the protection structures by press fitting.

In assembling the upper case 12 on the lower case 11, as shown in FIGS. 8A and 8B, the welded portions 16c, 20a (welded portions 16e, 20b) are inserted into the space 26a of the protection structure 26 by press fitting with the guide portion 26b guiding the welded portions 16c, 20a. As a result, the protection structure 26 covers the welded portions 16c, 20a, pressing the welded portions 16c, 20a towards each other. Accordingly, even if the fuse module 14 vibrates relative to the connector module 13, it is possible to prevent the welded portions 16c, 20a from being subjected to a force acting to separate them from each other.

Figure 2:
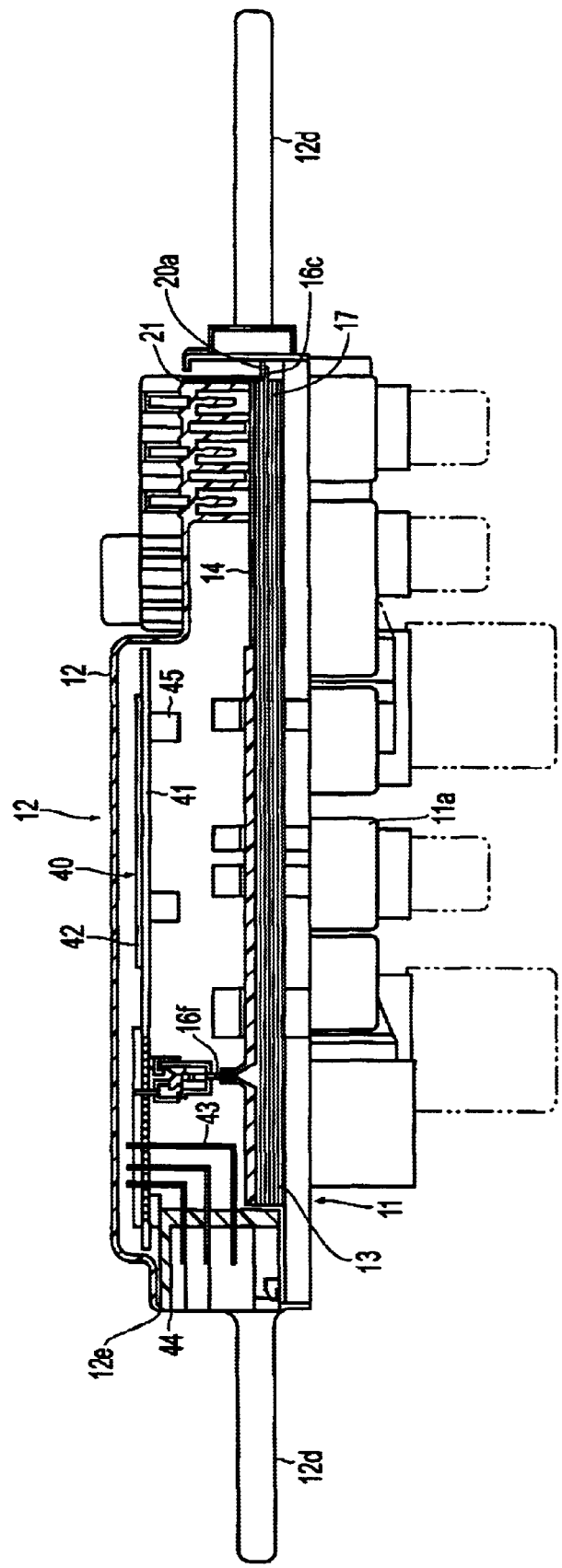
FIG. 2 is a sectional view showing a state in which the junction box of FIG. 1 has been assembled.
Figure 3:
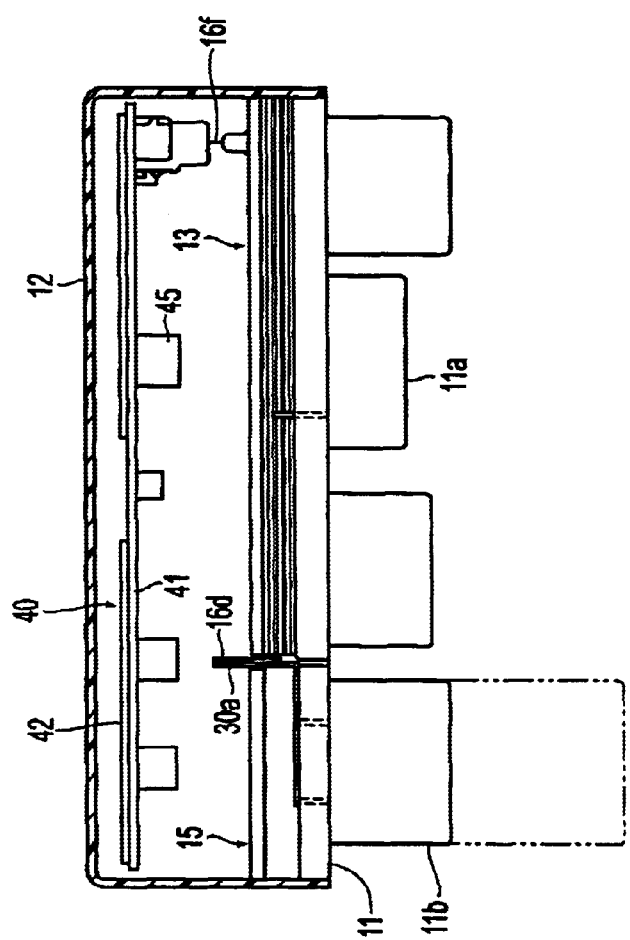
FIG. 3 is a sectional view, showing the junction box of FIG. 2, taken along a line perpendicular to FIG. 2.

At this time, as shown in FIG. 2, the connector portion 44 of the electronic control unit 40 is fitted in a notch 12e of the upper case 12. The assembling of the junction box 10 is completed by locking the upper case 12 and the lower case 11 to each other.

Figure 6:
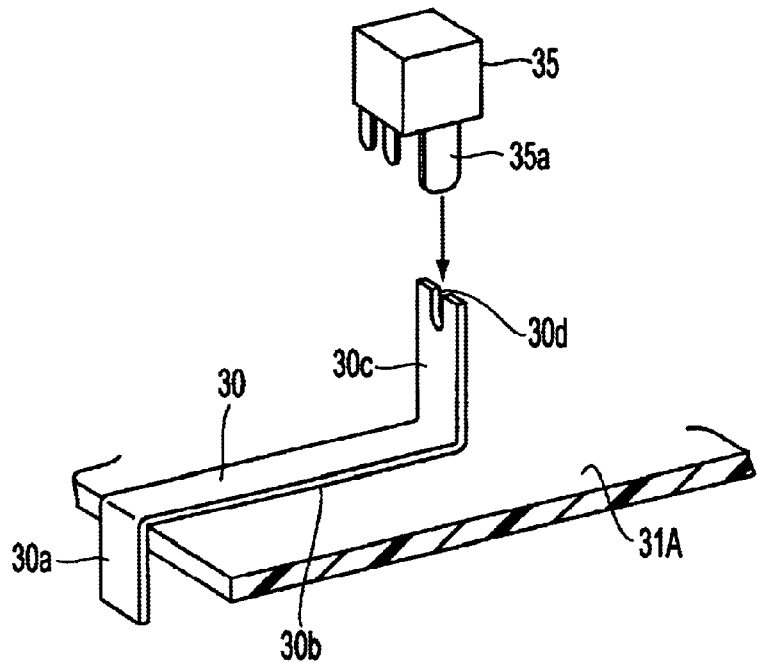
FIG. 6 is a schematic view showing a relay connection bus bar.

When the fuses 25 and the relays 35 are inserted into the fuse accommodation portions 11a and the relay accommodation portions 11b, respectively, as shown in FIGS. 5 and 6, they are fitted in and connected to the pressure connection grooves 20d of the fuse connection bus bars 20 and the pressure connection grooves 30d of the relay connection bus bars 30, respectively.

In the first embodiment, as the portion to be fitted in the protection structure 26 by press fitting and protected thereby, a combination of the welding portion 16c of the connector module 13 and the welding portion 20a of the fuse module 14 and a combination of the welding portion 16e of the connector module 13 and the welding portion 20b of the fuse module 14 have been exemplified. A combination of the welding portion 16d of the connector module 13 and the welding portion 30a of the relay module 15 may also be fitted in such a protection structure 26 and protected thereby.

Figure 10A:
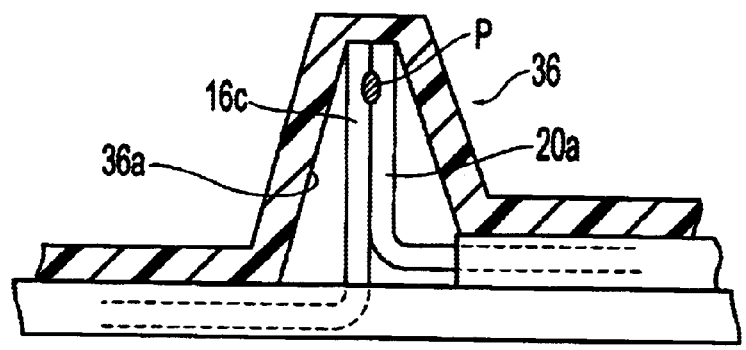
FIGS. 10A and 10B are sectional views each showing a modification of the protection structure.
Figure 10B:
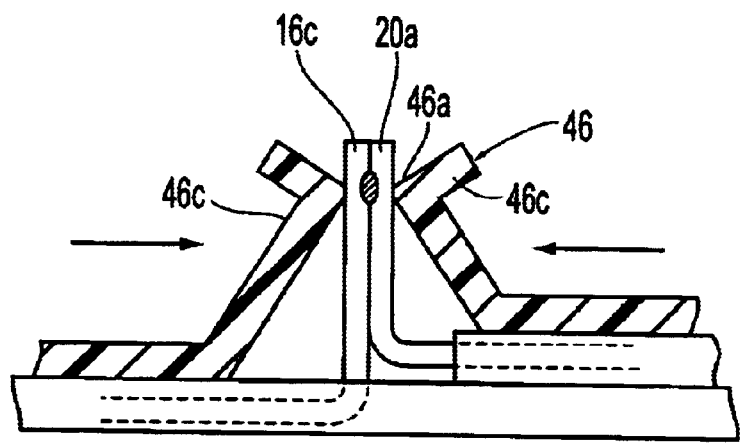

FIG. 10A shows a modification of the protection structure. In the modification, the width of the recess 36a of a protection structure 36 is reduced gradually toward the innermost end thereof to press only the front end of the welding portions 16c, 20a. In another modification, not shown, the welding portions 16c, 20a may be entirely covered with the protection structure 26 without forming the guide portion 26a. The protection structure may alternatively be formed by using a separate insulation material, separate from the lower case 11 and the upper case 12. For example, as shown in FIG. 10B, it is possible to form a protection structure 46 having a recess 46a between a pair of confronting sandwiching strips 46c to sandwich the welding portions 16c, 20a elastically.

Figure 11A:
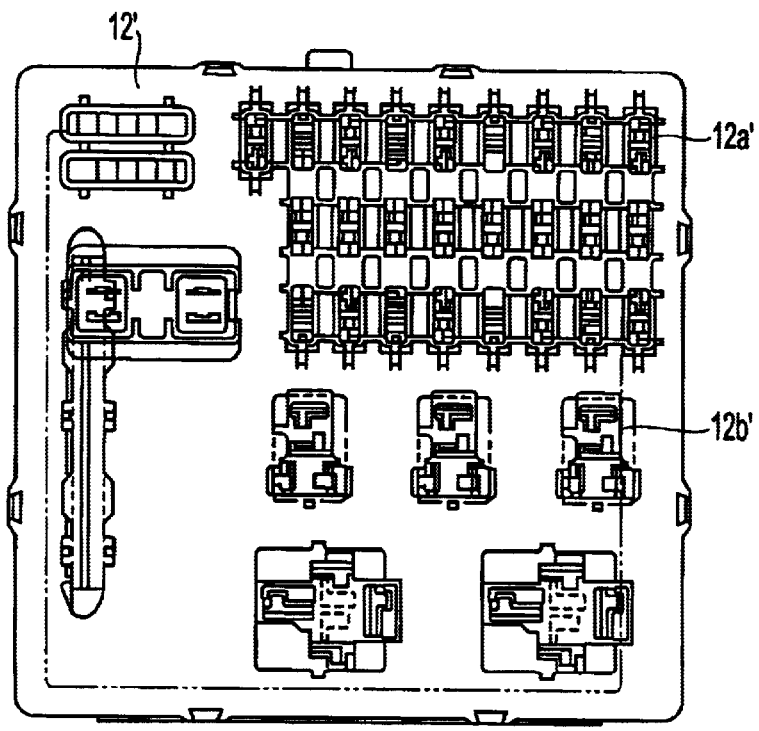
FIG. 11A is a plan view showing a junction box of another embodiment of the present invention.
Figure 11B:
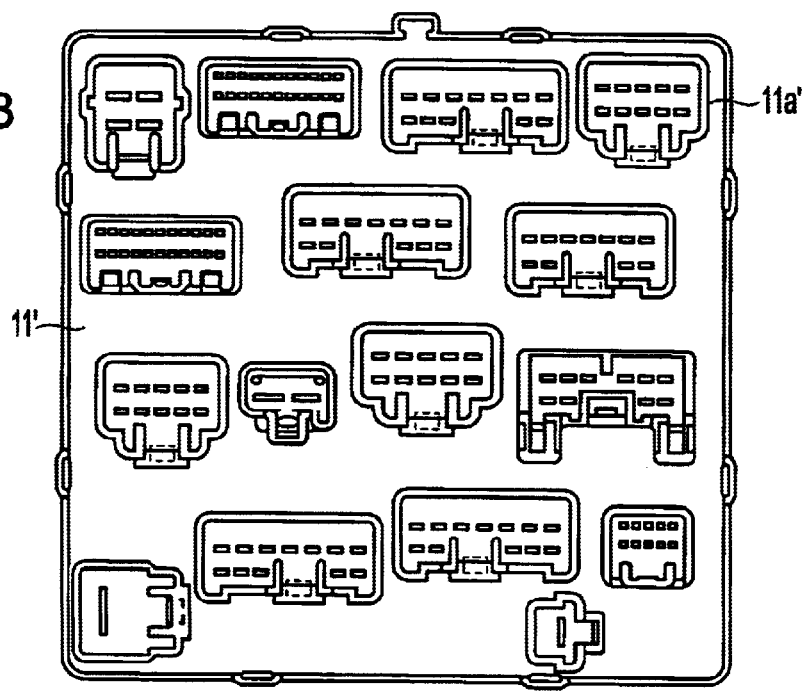
FIG. 11B is a bottom view showing the junction box of another embodiment of the present invention.
Figure 12:
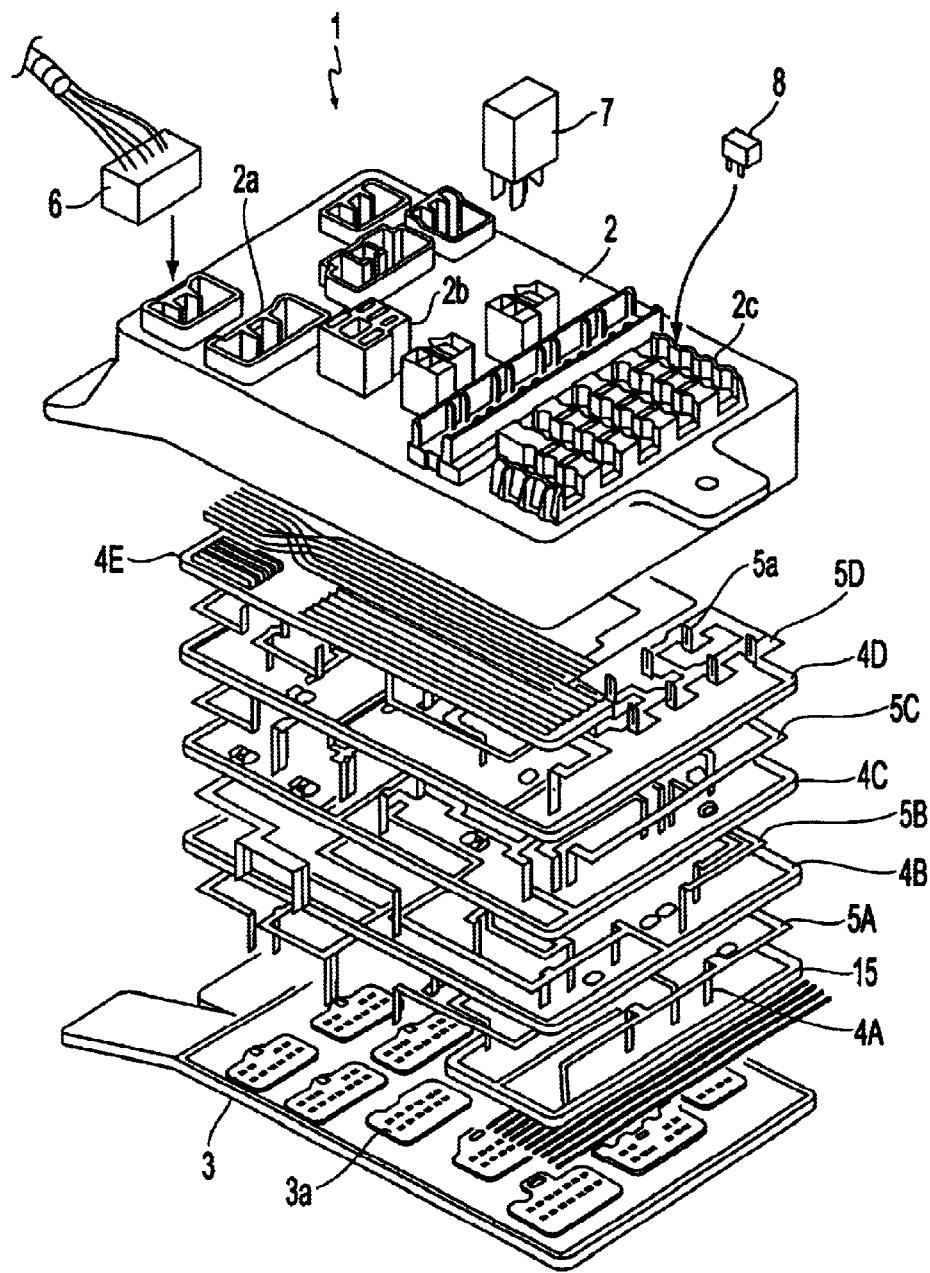
FIG. 12 is an exploded perspective view showing a conventional junction box.

In the first embodiment described above, the fuse module and the relay module are separate from each other. Instead, the fuse module and the relay module may be integral with each other to form a composite module. In this case, as shown in FIGS. 11A and 11B, a fuse receiving portion 12a' and a relay receiving portion 12b', in which terminal portions of bus bars of the composite module are disposed, are formed in the upper case 12'. Formed in the lower case 11' is a connector receiving portion 11a' in which terminal portions of bus bars of the connector module are disposed.

The junction box of the present invention is not limited the above-described embodiments. For example, each of the fuse module and the relay module may be divided into two parts, respectively. In this case, when the specification of any one of the fuses or the relays is altered, it is possible to replace only the module associated with the fuse or the relay which should be altered. However, if the fuse module and the relay module are divided into three or more parts, many assembling stages are required. Thus, it is preferable to divide the fuse module and the relay module into at most two parts, respectively, in the case of a large junction box.

The connector connection bus bars of the connector module, the fuse connection bus bars of the fuse module, and the relay connection bus bars of the relay module may be welded to each other in any of the following three patterns, selected according to the circuit design:

(1) A connector connection bus bar and a fuse connection bus bar are welded to each other.

(2) A connector connection bus bar and a relay connection bus bar are welded to each other.

(3) A connector connection bus bar is welded to a fuse connection bus bar and to a relay connection bus bar.

In case (3), the fuse connection bus bar may be welded to a welding portion of the connector connection bus bar at one end thereof; the relay connection bus bar may be welded to the welding portion of the connector connection bus bar at the other end thereof; and a tab provided at a third portion of the connector connection bus bar may be connected to a connector.

In the first embodiment, the connector module and the electronic control unit are accommodated in the lower and upper case parts. Additionally, it is possible to add a circuit including electrical wires connected to pressure contact terminals on the base circuit. The wires may also connect to connectors which fit in the connector receiving portion. It is also possible to add a circuit formed as an electrically conductive portion of an FPC (flexible printed circuit), a PCB (printed circuit board) or a highly electrically conductive resin molded with insulating resin.

As is apparent from the foregoing description, in the junction box of the present invention, the connector connection bus bars are separately provided from the fuse connection bus bars and the relay connection bus bars, using discrete substrates. Thus, tabs for connecting the connector connection bus bars, the fuse connection bus bars, and the relay connection bus bars to connectors, fuses and relays, respectively are disposed at different positions and do not overlap each other. Accordingly, it is unnecessary to increase the number of layers of the bus bars to provide them with tabs. Consequently, it is possible to form a thin junction box or otherwise to achieve a compact and logical lay out. For example, in the case of the construction of the first embodiment, the number of bus bars can be reduced from six layers required in the conventional junction box to four layers. Thus, it is possible to reduce the thickness of the junction box.

Further, as described above, because the fuse connection tabs and the relay connection tabs are separate from the bus bars of the base circuit, it is easy to handle and arrange the bus bars of the base circuit. Thus, it is possible to reduce the area of the bus bars and hence the area of the junction box. Consequently, in the case where the bus bars are divided and the ends of the bus bars are welded to each other, the area of the entire bus bars is not large and hence the area of the junction box is not increased.

Further, if the specification of the fuses and the relays is altered, the fuse module, the relay module or the composite module of the fuse module and the relay module is replaced. Thus, it is unnecessary to alter the entire upper and lower cases including the base circuit. That is, the construction can permit the alteration of the specification quickly and at low cost.

Furthermore, by providing the protection structures for the welded connections, risk of disconnection due to vibration etc. is minimized.

While the invention has been illustrated by the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical junction box comprising:
   (i) a casing;
   (ii) a connector circuit having at least one connector circuit insulation substrate and a plurality of first bus bars fixed on said connector circuit insulation substrate, said first bus bars being arranged to provide electrical connection to electrical connectors in use, and welding portions of said first bus bars projecting from the connector circuit insulation substrate;
   (iii) a fuse circuit having at least one fuse circuit insulation substrate, which is discrete from said connector circuit, and a plurality of second bus bars fixed on said fuse circuit insulation substrate, said second bus bars being arranged to provide electrical connection to fuses in use, and welding portions of said second bus bars projecting from the fuse circuit insulation substrate; and
   (iv) a relay circuit having at least one relay circuit insulation substrate which is discrete from said connector circuit, and a plurality of third bus bars fixed on said relay circuit insulation substrate, said third bus bars being arranged to provide electrical connection to relays in use, and welding portions of said third bus bars projecting from the relay circuit insulation substrate;
   (v) wherein at least one of said second bus bars is joined to one of said first bus bars by welded connections formed by welding together of at least a portion of the welding portions of the first bus bars to corresponding welding portions of the second bus bars: and wherein at least one of said third bus bars is joined to one of said first bus bars by welded connections formed by welding together of at least a portion of the welding portions of the first bus bars to corresponding welding portions of the third bus bars; and
   (vi) wherein at at least one of said welded connections, said junction box is provided with a protection structure which receives said welding portions of the at least one of said welded connections and presses said welding portions of the at least one of said welded connections towards each other.

2. An electrical junction box according to claim 1 wherein said welding portions of said at least one of said welded connections are inserted in said protection structure in a press-fit manner.

3. An electrical junction box according to claim 1 wherein said protection structure includes a widening guide portion that guides said welding portions into said protection structure during assembly.

4. An electrical junction box according to claim 1 wherein said protection structure is integral with said casing.

5. An electrical junction box according to claim 1 wherein said fuse circuit insulation substrate and said relay circuit insulation substrate are discrete from each other, whereby said fuse circuit and said relay circuit constitute separate modules in said junction box.

6. An electrical junction box according to claim 1 wherein said fuse circuit insulation substrate and said relay circuit insulation substrate are combined as a unitary common substrate carrying said second bus bars and said third bus bars, whereby said fuse circuit and said relay circuit constitute a combined module in said junction box.

7. An electrical junction box according to claim 1, wherein said casing comprises upper and lower ease parts which are respectively molded synthetic resin members, at least one of said upper and lower case parts comprising connector sockets that receive electrical connectors in use.

8. An electrical junction box according to claim 1 wherein the welding portions at each said welding connection are joined by one of ultrasonic welding, resistance welding, laser welding and gas welding.

9. A vehicle in which an electrical junction box according to claim 1 is mounted.

* * * * *